United States Patent [19]

Miwa et al.

[11] Patent Number: 5,063,528
[45] Date of Patent: Nov. 5, 1991

[54] RECORD POSITION MEASURING APPARATUS

[75] Inventors: Hiroshi Miwa, Amagasaki; Atuko Miyoshi, Fukuyama; Syungi Satou, Fukuyama; Masayuki Kaseda, Fukuyama, all of Japan

[73] Assignee: Mitsubishi Denki Kabushiki Kaisha, Japan

[21] Appl. No.: 386,120

[22] Filed: Jul. 28, 1989

[51] Int. Cl.$^5$ .............................................. B41F 5/08
[52] U.S. Cl. .................................. 364/559; 101/211; 364/526
[58] Field of Search ...................... 364/560, 561, 526; 33/505; 101/211

[56] References Cited

U.S. PATENT DOCUMENTS

| | | |
|---|---|---|
| 4,469,025 | 9/1984 | L,öffler et al. ................... 101/211 X |
| 4,494,875 | 1/1985 | Schramm et al. ............... 364/526 X |
| 4,546,700 | 10/1985 | Kishner et al. ..................... 101/211 |
| 4,668,982 | 5/1987 | Tinnerino ............................ 358/101 |
| 4,849,914 | 7/1989 | Medioni et al. ..................... 364/526 |
| 4,852,485 | 8/1989 | Brunner .............................. 101/211 |
| 4,878,977 | 11/1989 | Kueppers ......................... 101/211 X |
| 4,881,181 | 11/1989 | Jeschke et al. ................. 101/211 X |
| 4,932,320 | 6/1990 | Brunetti et al. ................. 101/211 X |

Primary Examiner—Parshotam S. Lall
Assistant Examiner—S. A. Melnick
Attorney, Agent, or Firm—Leydig, Voit & Mayer

[57] ABSTRACT

A record position measuring apparatus comprising irradiation means for irradiating a light of a plurality of predetermined wavelength zones to a recording medium on which a color pattern is recorded, two-dimensional imaging means for imaging the color pattern to provide image information, storing means for storing the image information, and operating means for calculating the distance between the color pattern and a reference position according to the image information stored in the storing means.

13 Claims, 8 Drawing Sheets

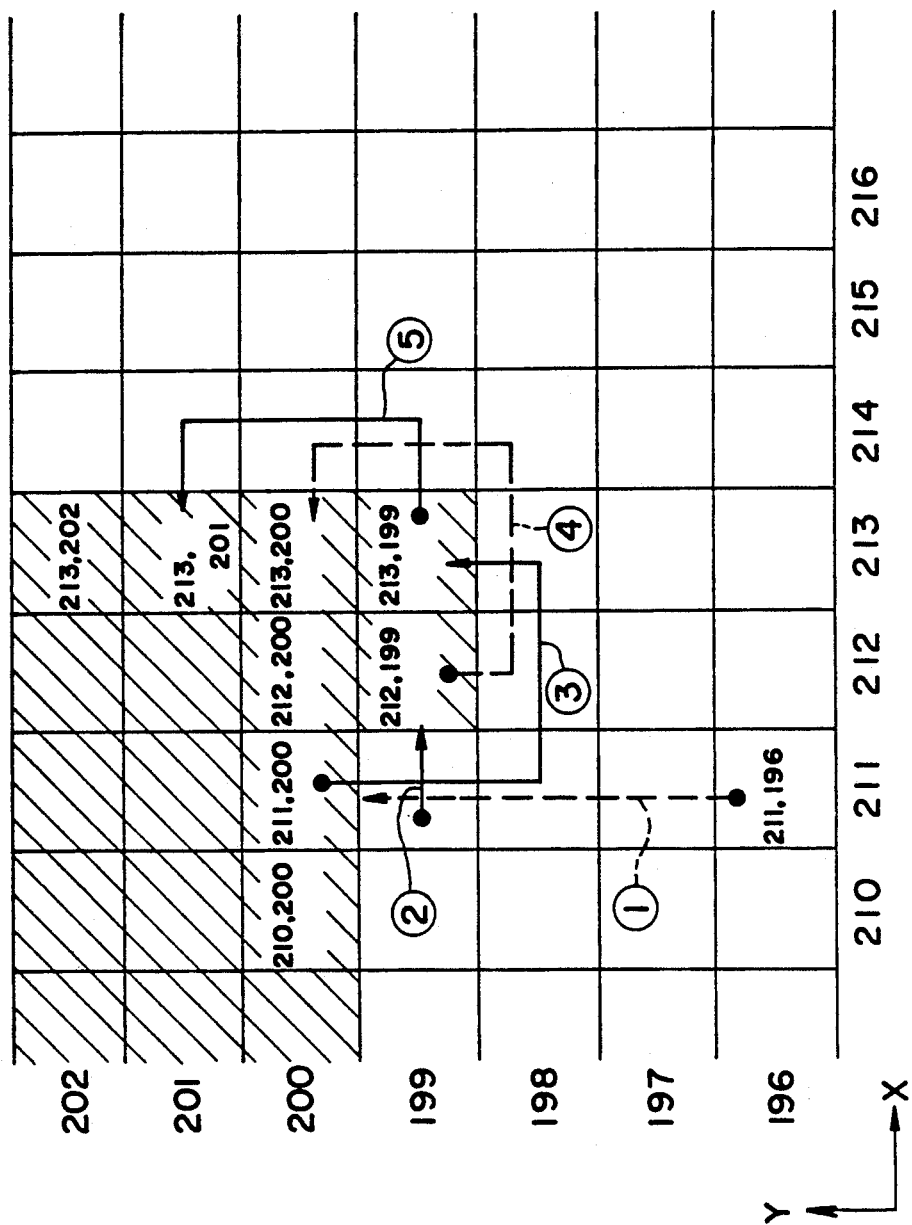

(Xc, Yc)

YELLOW  MAGENTA  CYAN

CYAN
MAGENTA
YELLOW

RECORD POSITION MEASURING APPARATUS

BACKGROUND OF THE INVENTION

This invention relates to a record position measuring apparatus for evaluating the quality of the record (printout) of a printer or the like and, more particularly, to a record position measuring apparatus for measuring an amount of the displacement of the recorded position of the basic colors such as yellow, magenta, cyan, etc.

FIG. 1 is a perspective view illustrating a conventional record position measuring apparatus disclosed in Japanese Patent Laid-Open No. 60-242343, for example. In FIG. 1, the reference numeral 1 designates a planer bed, 2 is a substantially U-shaped gate mounted on the bed 1 so as to bridge over the central portion of the bed 1, 3 is a moving mechanism mounted on the upper portion of the gate 2, 4 is a He-Ne laser device mounted to the moving mechanism 3, 5 is a unit attached to one end face of the He-Ne laser device 4, 6 is a controller connected to the bed 1, 7 is a computer connected to the controller 6, 8 is a monitor connected to the computer 7, 9 is a printer connected to the computer 7, and 10 is a printing paper mounted on the bed 1 and on which a test pattern is printed.

FIG. 2 is a front view schematically illustrating the interior of the unit 5 shown in FIG. 1. In FIG. 2, 5a, 5b and 5c are lenses, and 5d is a photoelectric conversion element. The character L designates laser beam.

The operation of the conventional apparatus as above described will now be described in conjunction with FIG. 3, which is a plan view showing a printing paper 10 on which a test pattern is printed.

First, the printing paper 10 on which the test pattern shown in FIG. 3 is placed on the bed 1, and the density of the printing paper 10 is measured while the bed 1 is being moved in the Y-direction by an unillustrated mechanism. When the laser beam crosses the line of the cross pattern 10a which extends in the X-axis, its position is detected. Then, the He-Ne laser apparatus 4 and the unit 5 are moved into the X-direction by the moving mechanism 3 to detect the position of the line of the pattern 10a extending in the Y-axis.

That is, the laser beam L emitted from the He-Ne laser apparatus 4 is irradiated onto the printing paper 10 through the lenses 5a and 5b. Then, the light reflected at the printing paper 10 is collected on the photoelectric transducer element 5d by the lens 5c, whereby the information on the reflected light (the positional information of the cross pattern 10a) is collected through the control apparatus 6 on the controller 6.

Thus, by obtaining the position of the crossing point of the cross pattern 10a and comparing it with a reference position, the displacement of the printed position of the cross pattern 10a can be measured. When neccessary, the measured amount of the displacement can be output on the monitor 8 and the printer 9.

In the record position measuring apparatus described above, when it is desired to measure the amount of the displacement or misalignment of each basic color such as yellow, magenta, and cyan, etc. printed on the printing paper by a color printer, the problems which will be discussed below arise.

Firstly, since the He-Ne laser apparatus is used as an irradiation light souce, the density change of the test pattern of a particular color cannot be measured by the photoelectric transducer element 5d. In particular, since the He-Ne laser apparatus which emits a red laser light is used, it is impossible to achieve density measurement as to magenta or red.

Secondly, since the laser beam L scanns in the X-and Y-directions, the bed 1 and the moving mechanism 3 must be driven respectively in each direction for determining a single record position, requiring relatively long time for processing.

Thirdly, the boundaries between the ink and the paper at which the density abruptly changes, are curved within a width of about 50 μm because of the rough paper surface and the fibers and cavities of the paper. Therefore, with the system in which the laser beam L sequentially scans in the X- and Y-directions, only a localized pattern position can be measured, resulting in a large error in the pattern position. While the measuring accuracy can be improved by measuring the density changing position at a plurality of measuring points and statistically processing the measured data, this measure needs relatively long time for driving the bed 1 and the moving mechanism rendering it practically impossible to use.

SUMMARY OF THE INVENTION

Accordingly, one object of the present invention is to provide a record position measurement apparatus free from the above mentioned problems of the conventional apparatus.

Another object of the present invention is to provide a record position measurement apparatus in which the record position among the basic colors on the color recording medium can be made in a short time.

Another object of the present invention is to provide a record position measurement apparatus in which the record position among the basic colors on the color recording medium can be made with great precision.

Another object of the present invention is to provide a record position measurement apparatus in which the record position among the basic colors on the color recording medium can be made with great precision at a high speed.

With the above objects in view, the record position measuring apparatus of the present invention comprises irradiation means for irradiating light of a plurality of predetermined wavelength zones to a recording medium on which a color pattern is recorded, two-dimensional imaging means for imaging the color pattern to provide image information, storing means for storing the image information, and operating means for calculating the distance between the color pattern and a reference position according to the image information stored in the storing means.

According to the present invention, the irradiating means irradiates light of the predetermined wavelength zones onto the recording medium so that the boundaries between the recorded basic colors can be identified, and the two-dimensional imaging means and the storing means measure the image information (the density information) two-dimensionally distributed, and the operating means calculates the amount of displacement of the record position from the image information and the reference position.

BRIEF DESCRIPTION OF THE DRAWINGS

The present invention will become more readily apparent from the following detailed description of the preferred embodiment of the present invention taken in conjunction withe accompanying drawings, in which:

FIG. 9 is an explanatory view for explaining the state in which the binary coded reflection intensity I is stored in memory region of the image memory;

DESCRIPTION OF THE PREFERRED EMBODIMENT

Figure 1:
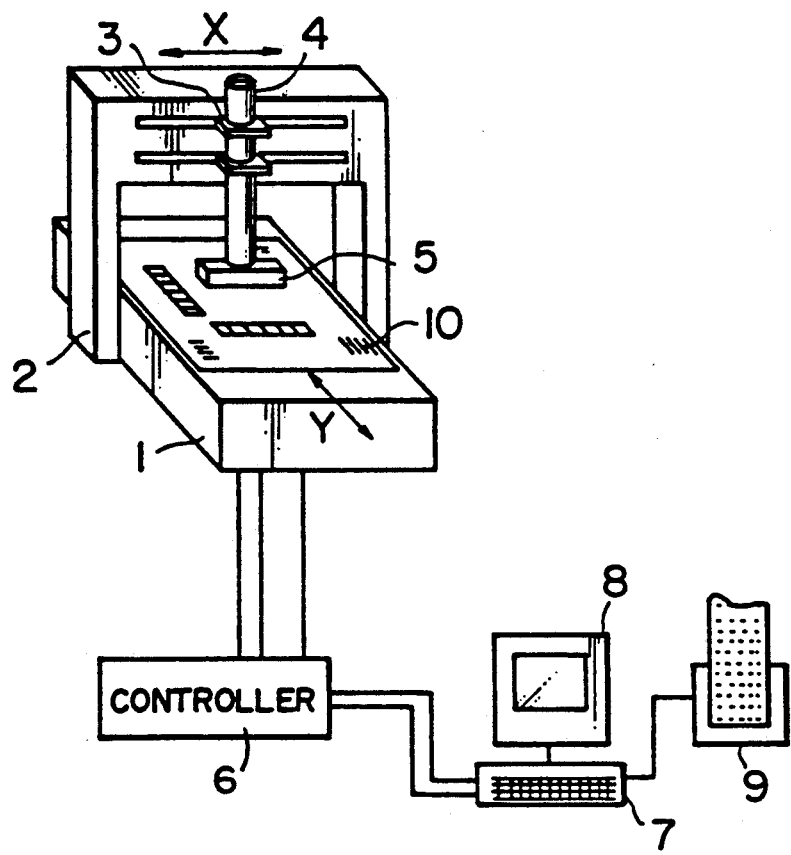
FIG. 1 is a perspective view illustrating a conventional record position measurement apparatus.
Figure 2:
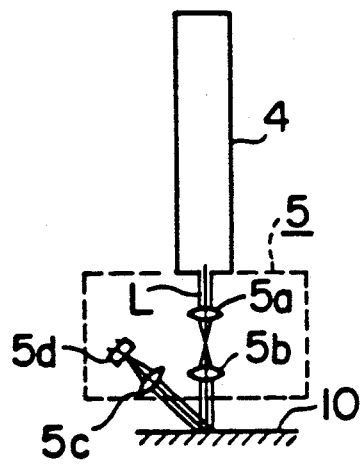
FIG. 2 is a schematic front view showing the inside of the conventional unit.
Figure 3:
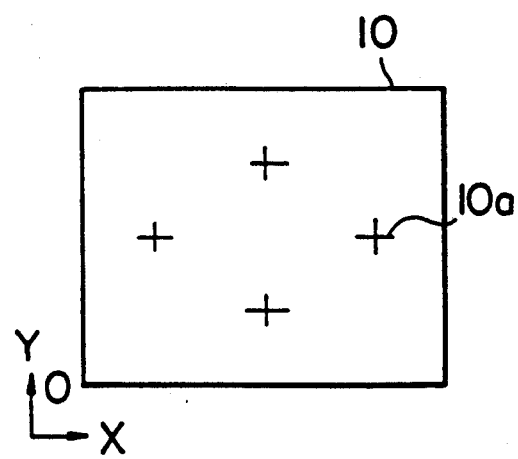
FIG. 3 is a plan view showing a conventional printing paper.
Figure 4:
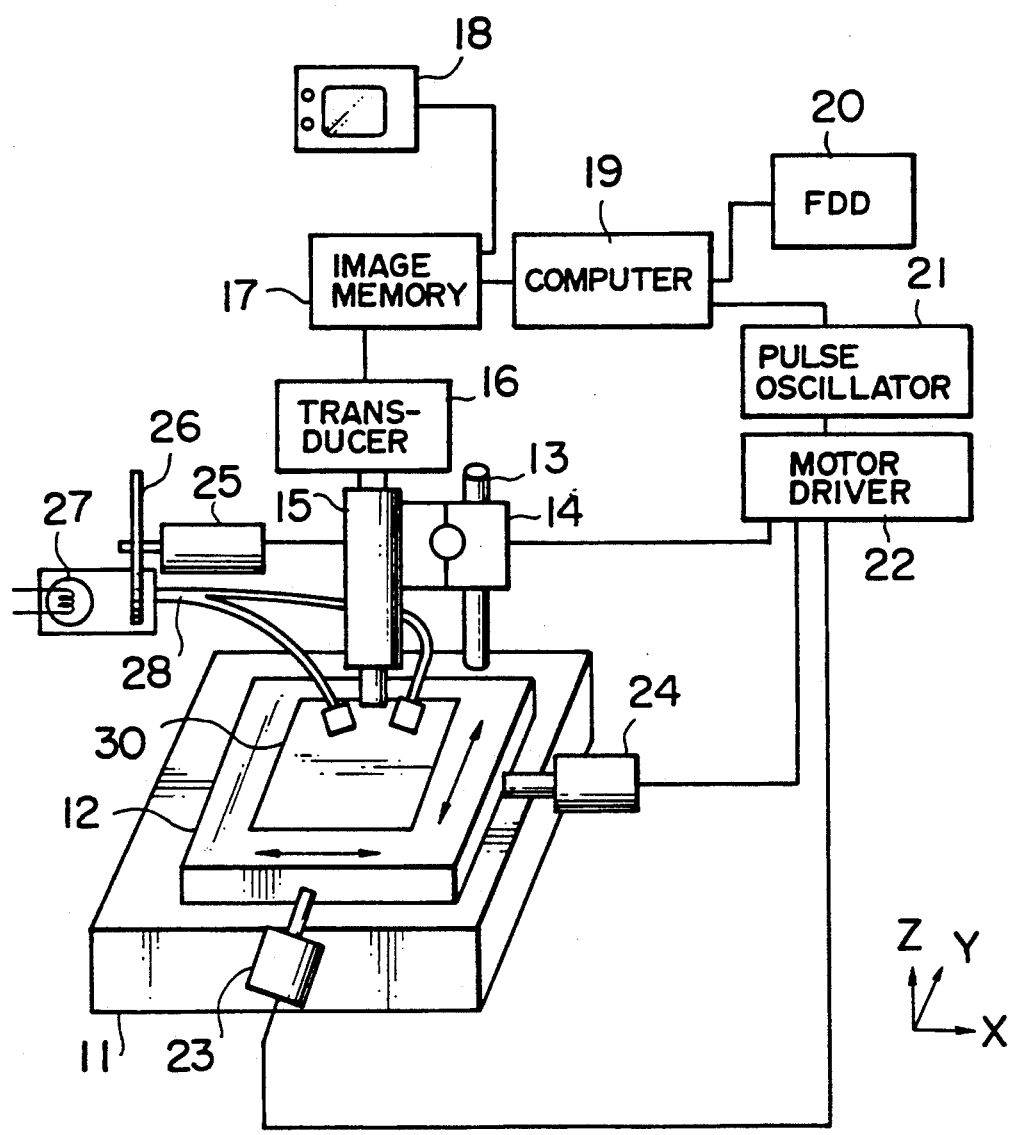
FIG. 4 is a schematic perspective view illustrating one embodiment of the acceleration detector of the present invention.

FIG. 4 is a schematic perspective view showing one embodiment of the record position measurement apparatus of the present invention. In FIG. 4, the reference numeral 11 is a planer bed, 12 is a planer X-Y table mounted on the top surface of the bed 11 and is smaller than the bed 11, 13 is a support post disposed on the bed 11, 14 is a fine movement bed mounted on the support post 13, 15 and 16 together constitute a two-dimensional imaging means, 15 being an optical system connected to the fine movement bed and 16 being a two-dimensional photoelectric transducer element coupled to the optical system 15 in the illustrated embodiment 17 is a storing means, which is an image memory connected to the two-dimensional photoelectric conversion element 16, 18 is a monitor TV connected to the image memory 17, 19 is a computer connected to the image memory 17, 20 is a floppy disc drive (FDD) connected to the computer 19, 21 is a pulse oscillator connected to the computer 19, 22 is a motor driver connected to the pulse oscillator 21, 23 and 24 are pulse motors connected to the motor driver 22. The reference numerals 25~28 together constitute an irradiation means, in which, in the illustrated embodiment, 25 is a pulse motor connected to the motor driver 22, 26 is a disc-shaped filter disc connected to a rotary shaft of the pulse motor 25, 27 is a white light source having the filter disc 26 disposed at its front portion, and 28 is a forked glass fiber connected to the front portion of the white light source 27, and 30 is a printing paper mounted on the X-Y table 12 and having a color pattern printed on it. Two irradiation ports of the glass fiber 28 are positioned in the vicinity of the optical system 15 and in the vicinity of the top surface of the printing paper 30. The pulse motors 23 and 24 are mounted on the sides of the X-Y table 12 extending in the X-direction and Y-direction.

Figure 5:
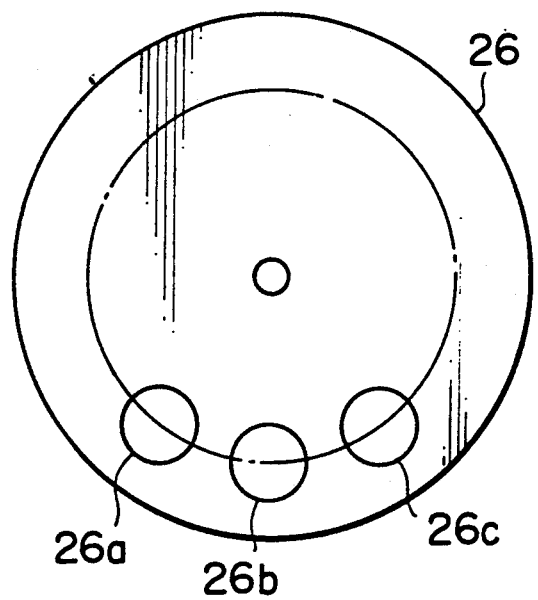
FIG. 5 is a plan view showing the filter disc shown in FIG. 4.

FIG. 5 is a plan view illustrating the filter disc 26 shown in FIG. 4. In FIG. 5, 26a, 26b and 26c are a red filter, a green filter and a blue filter, respectively, disposed on the disc at the equal radial distance.

Figure 6:
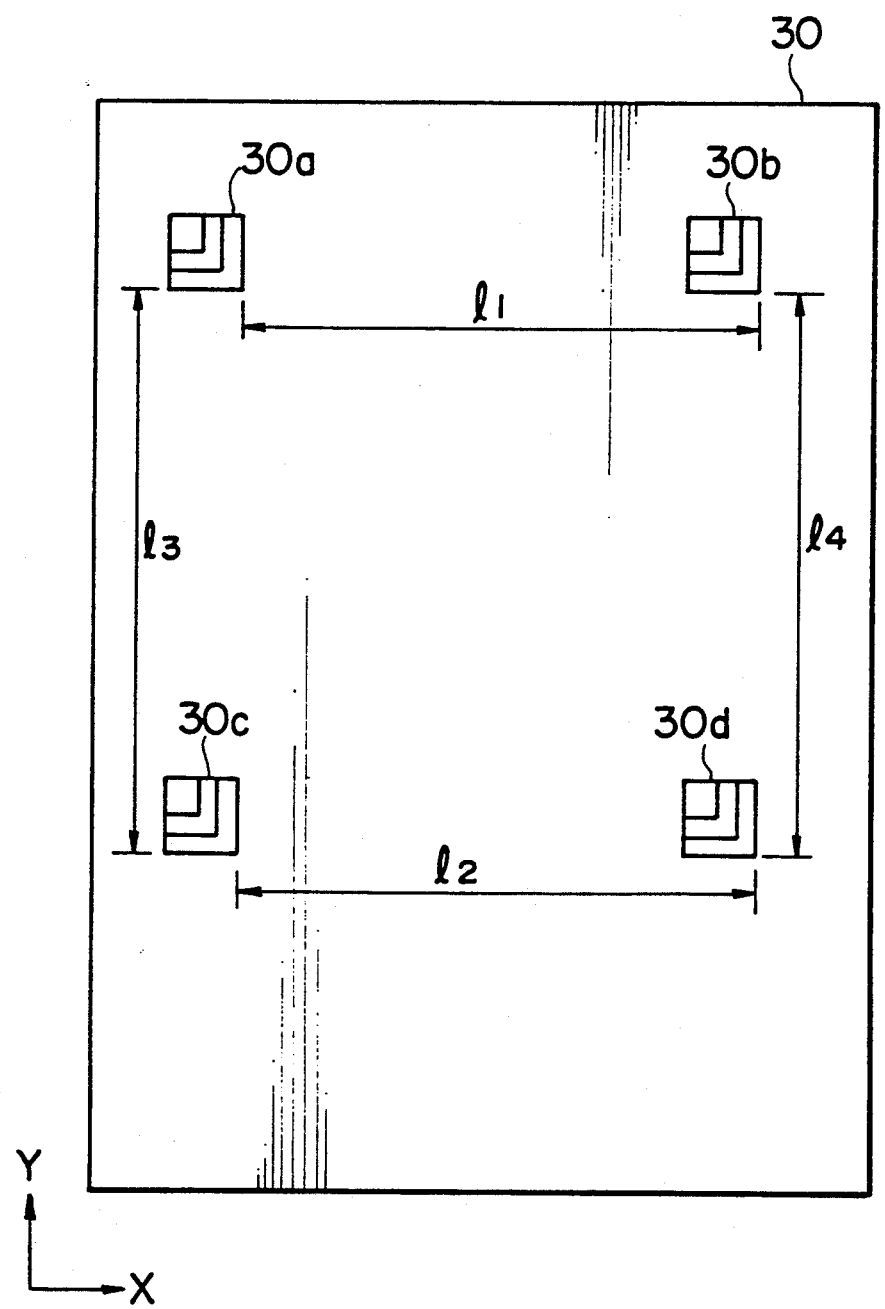
FIG. 6 is a plan view showing the printing paper shown in FIG. 4.

FIG. 6 is a plan view illustrating the printing paper 30 shown in FIG. 4. In FIG. 6, 30a, 30b, 30c and 30d are square patterns printed on the four corners of the printing paper 30.

Figure 7A:
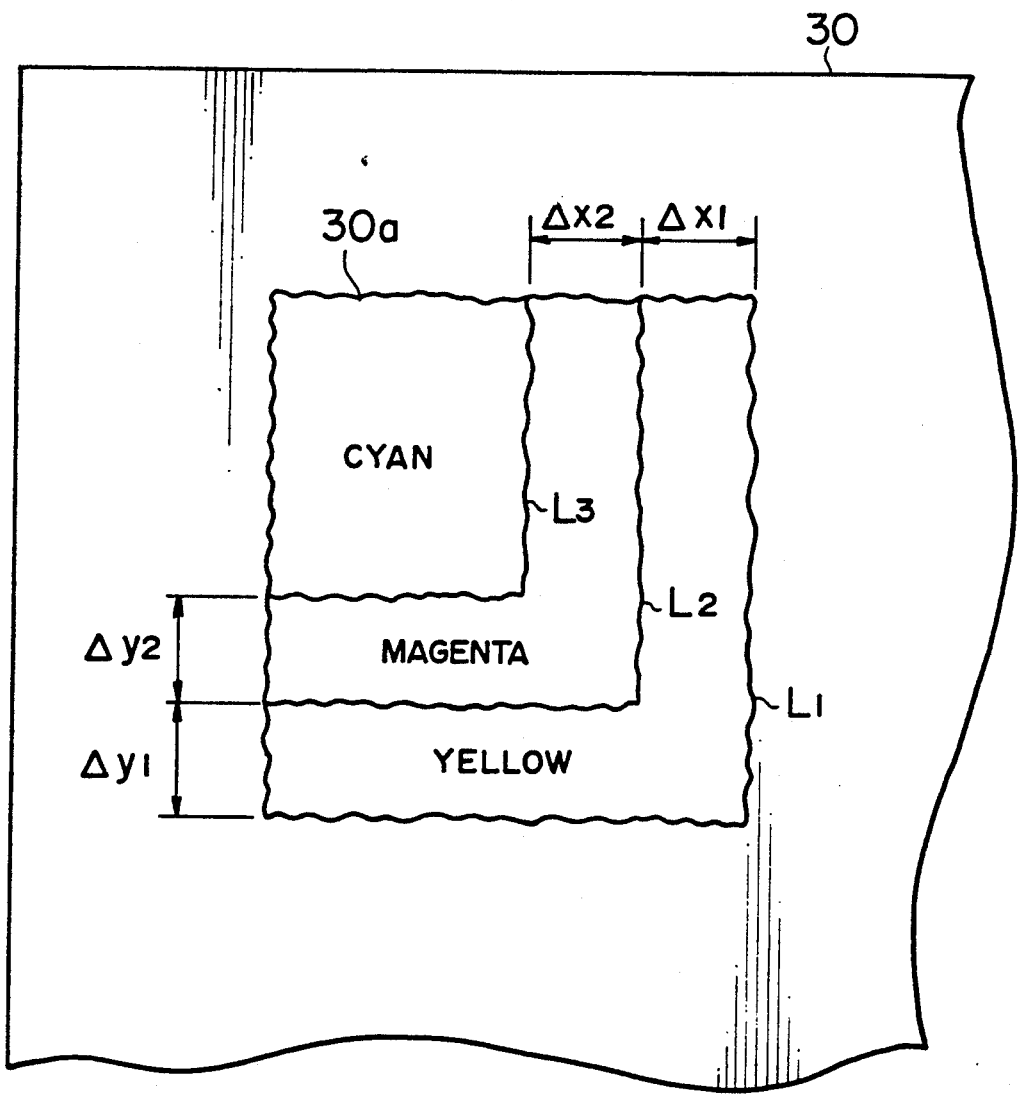
FIG. 7(a) is an enlarged of a portion of the printing paper shown in FIG. 4.
Figure 7B:
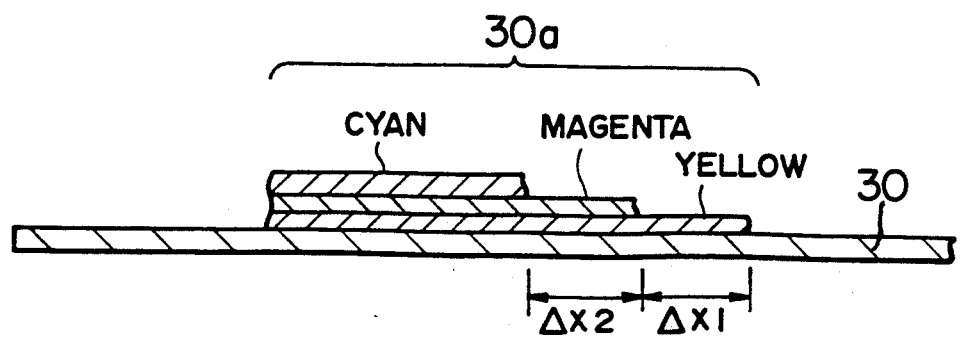
FIG. 7(b) is a cross section view of FIG. 7(a)

FIG. 7a is an enlarged partial plan view illustrating one portion of the printing paper 30 shown in FIG. 4, and FIG. 7b is a sectional view showing a section of the printing paper shown in FIG. 7a. In these figures, the square pattern 30a is formed by three square layers of yellow, magenta and cyan inks printed on the printing paper 30 in an overlapping relationship. The yellow square layer is directly printed on the paper 30. The magneta square layer is smaller than the yellow layer by $\Delta x_1$ and $\Delta y_1$ in the X- and Y-direction, respectively and is printed on the yellow square layer with its top and left edges in registry with those of the yellow square layer. The cyan square layer is smaller than the magenta layer by $\Delta x_2$ and $\Delta y_2$ in the X- and Y-direction, respectively and is printed on the magenta square layer with its top and left edges in registry with those of the magenta square layer. Because of the overlapped colors, yellow and magenta make red, and yellow, magenta and cyan make black. The boundaries of each of the color layers are indicated by L1, L2 and L3.

The operation of the above described embodiment will now be described in conjunction with FIG. 8.

Figure 8:
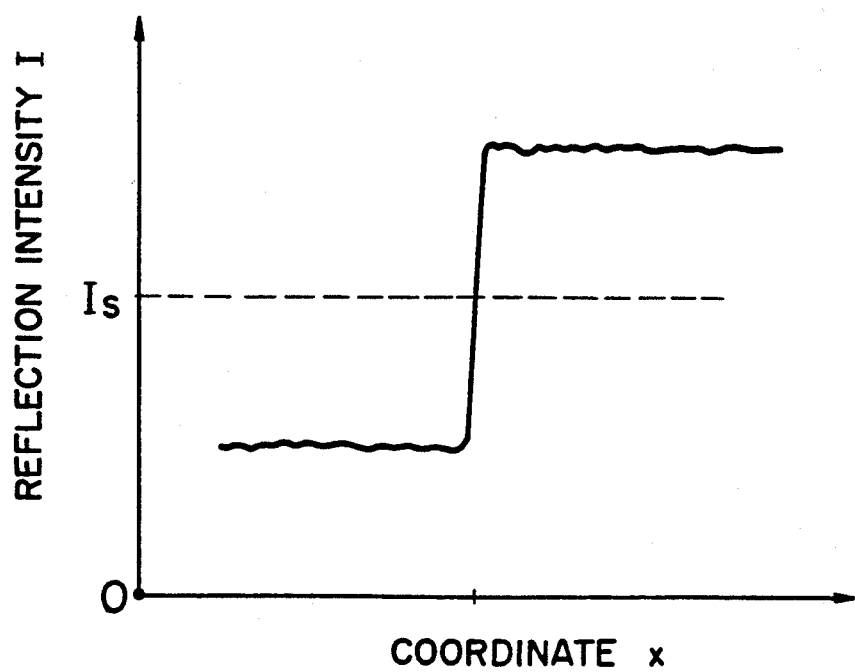
FIG. 8 is a graph showing a characteristic curve of reflection intensity I plotted aginst the position on the X-axis.

FIG. 8 is a graph showing a characteristic curve of a reflection intensity I plotted aginst the position on the X-axis, wherein the axis of abscisa represents the position in the X-direction and the axis of ordinate represents the reflection intensity I. ls designates a threshold value of the reflection intensity I.

Firstly, the printing paper 30 is mounted at a predetermined position on the X-Y table 12, and the computer 19 is operated by the operation starting command from an unillustrated keyboard. A command from this computer 19 starts the operation of the pulse oscillator 21 to supply pulses to the motor driver 22. The pulse motors 23 and 24 are driven by the motor driver 22 in accordance with the number of the pulses supllied from the pulse oscillator 21, and the X-Y table 12 is moved by the pulse motors 23 and 24 in the X- and Y-directions so that the optical axis of the optical system 15 coincides with the square pattern 30a on the printing paper 30.

Then, the filter disc 26 is rotated by the pulse motor 25 controlled by the computer 19 so that the blue filter 26c is inserted in the light path between the white light source 27 and the glass fiber 28. The white light source 27 emits white light, and the blue light passed through the blue filter 26c irradiates the printing paper 30. The blue light is reflected at the white portion of the printing paper 30, and the blue light is absorbed at the portions on which yellow, magenta and cyan inks are printed. As shown in FIG. 8, the reflection intensity I of the blue light abruptly changes at the boundary L1 between the yellow portion and the white portion.

The reflected blue light is focused by the optical system 15 on the two-dimensional photoelectric transducer element 16, and an electric signal in accordance with the reflection intensity I is outputted onto the image memory 17 by the two-dimensional photoelectric transducer 16. The electric signal is converted by the image memory 17 into a digital signal of which one word is made of 10 bits and is stored within a memory space composed of 512×512 words and at the same time transferred to the computer 19.

Thus, the position of the boundary L1 can be determined by the computer 19 on the basis of the digital signal in accordance with the procedure which will be discussed later.

As the above operation is completed, the next operation is started. First, the pulse oscillator 21 is started by the rotating command from the computer 19 to output pulses to the motor driver 22. According to the number of the pulses supplied from the pulse oscillator 21, the pulse motor 25 is driven by the motor driver 22, whereby the filter disc 26 is rotated by the pulse motor 25 so that the green filter 26b is inserted into the light axis between the white light source 27 and the glass fiber 28.

The green light is reflected by the white portion of the printing paper 30 and by the portion with the yellow ink, and the green light is absorbed by the portions on which magenta and cyan is recorded. Therefore, the reflection intensity I abruptly changes at the boundary L2 between the yellow portion and the portion in which magenta overlaps yellow.

The reflection of the green light is converted into an electrical signal in accordance with the reflection intensity I in a manner similar to the above blue light and is supplied to the image memory 17 by the two-dimensional photoelectric transducer 16. This electric signal is converted by the image memory 17 into a digital signal to be stored into the memory space of the image memory 17 as well as to be transferred to the computer 19.

Thus, the position of the boundary L2 can be determined by the computer 19.

When the above operation is finished, the next operation starts. In response to the rotating command from the computer 19, the filter disc 26 is rotated through the pulse oscillator 21, the motor driver 22 and the pule motor 25 so that the red filter 26a is inserted into the light axis between the white light source 27 and the glass fiber 28.

The red light is absorbed by the black portion in which the yellow, the magenta and the cyan inks overlap, and the remaining portion reflects the red light. Therefore, the reflection intensity I abruptly changes at the boundary L3 defined between the portion in which yellow and magenta overlap and the portion in which yellow, magenta and cyan overlap, so that the position of the boundary L3 can be determined in a similar manner to the case of the blue light and the green light.

When the positions of the boundaries L1, L2 and L3 are determined, the record distance (L3-L2) between the cyan and the magenta and the record distance (L3-L1) between the cyan and the yellow can respectively be determined by the computer 19. The record distances (L3-L2) and (L3-L1) are compared with a reference distance and the computer 19 calculates the printing displacement of the magenta and yellow inks with respect to the cyan ink.

After finishing the above process, the same process is repeated as to the other square patterns such as the square pattern (30b)→the square pattern (30d)→the square pattern (30c)→in the named order on the printing paper 30.

That is, the pulse motor 23 or 24 is rotated by the computer 19 to shift the X-Y table 12 in the X- and Y directions by predetermined distances so that the square pattern 30b, 30d or 30c coincides with the light axis of the optical system 15.

The displacement of the magenta and yellow inks relative to the cyan ink in the square pattern 30b, 30d and 30c is calculated by the computer 19 in a procedure similar to that used as to the square pattern 30a.

After the displacements of the image as above described are determined for all of the square pattern 30a~30d, the largest, the smallest and the mean values of the dispslacement of the image are determined by the computer 19.

Further, in order to measure the displacement of the square patterns 30a~30d, the number of the driving pulses supplied to the pulse motors 23 and 24 for moving the X-Y table 12 into the X- and Y-directions, and the positions of the color boundaries L1, L2 and L3 in the square patterns 30a~30d are used to determine, as shown in FIG. 6, the distance $l_1$ between the square patterns 30a and 30b, the distance $l_2$ between the square patterns 30c and 30d, the distance $l_3$ between the square patterns 30a and 30c and the distance $l_4$ between the square patterns 30b and 30d, and further these distances are compared with a reference distance and the computer calculates the printing displacement of each color pattern relative to a chosen reference pattern.

Thereafter, the pulse motors 23 and 24 are rotated by the computer 19 to drive the X-Y table 12 by the pulse motors 23 and 24 to the initial position and halt it there.

The procedure for determining the positions of the boundaries L1, L2 and L3 in the above described embodiment will now be described with reference to FIGS. 9, 10, 11 and 12.

FIG. 9 is an explanatory view showing the state in which the binary coded reflection intensity I is stored in the memory space of the image memory 17. In FIG. 9, the axis of ordinate and the axis of abscisa designate addresses in the X-and Y-directions.

Figure 10:
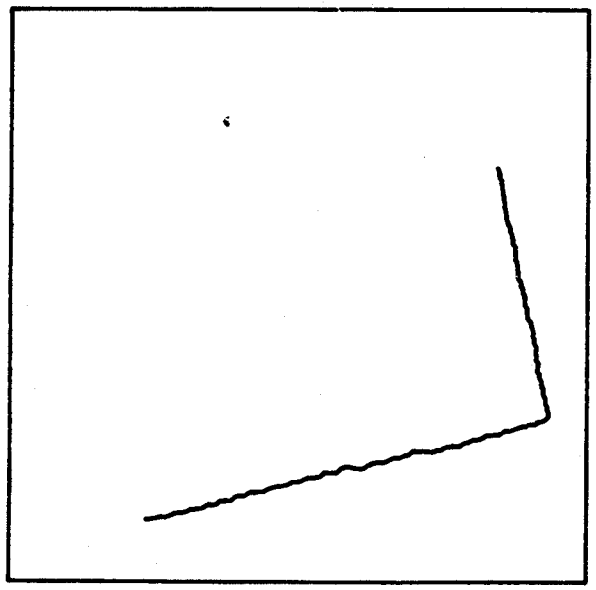
FIGS. 10, 11 and 12 are explanatory views showing how the boundary co-ordinate axis data can be plotted on the X-Y plane.
Figure 11:
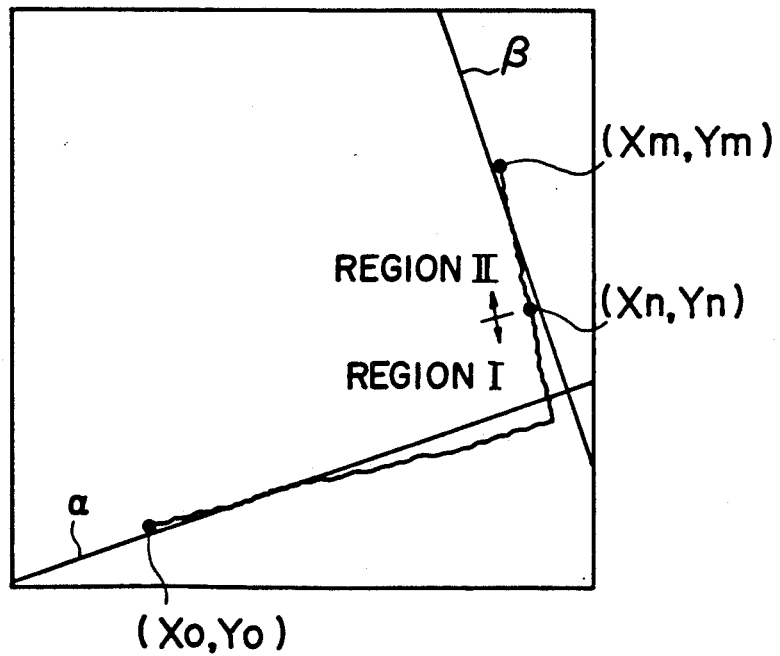
Figure 12:
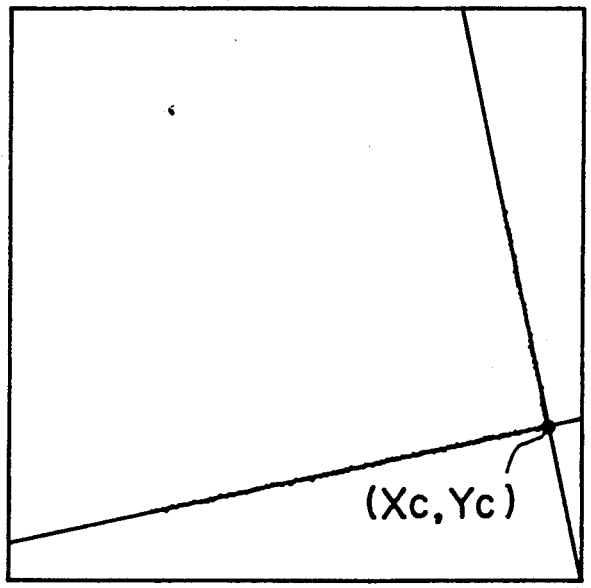

FIGS. 10, 11 and 12 are explanatory views showing how the boundary data is plotted on the X-Y plane. In FIG. 11, α and β designate straight lines.

According to whether or not the reflection intensity I is greater than a predetermined threshold value Is, the date is binary coded as "1" or "0" by the image memory 17 to be stored again in the 512×512 word memory space in the image memory 17. That is, the shaded portion corresponds to the portion in which yellow ink is recorded.

On the basis of the binary coded reflection intensity I, the position of the boundary is determined by the 3×3 matrix boundary extraction method. As shown in FIG. 9, each word is checked to find an address in which the reflection intensity I is "0" in the Y-direction (pass ①) from the address (211, 196) in which the reflection intensity is apparently "1" until the address (211, 200) in the shaded portion is found.

Then, with this address (211, 200) as the center, and with the address (211, 199) in which the reflection intensity I is apparently "1" as the starting point, each word is checked counterclockwise (pass ②) until the address (212, 199) in which the reflection intensity I changes from "1" to "0".

Then, with this address (212, 199) as the center, and with the address (211, 200) which was the center of the previous search as the starting point, each word is checked counterclockwise (pass ③) until the address (213, 199) in which the reflection intensity I changes from "1" to "0" is found.

Then, with this address (213, 199) as the center, and with the address (212, 199) which was the center of the previous search as the starting point, each word is checked counterclockwise (pass ④) until the address (213, 200) in which the reflection intensity I changes from "1" to "0" is found.

Similarly, the address (213, 201) is searched through the path ⑤.

By repeating the above described procedure, the boundary coordinate data (211, 200), (212, 199), (213, 199), (213, 200), (213, 201), (213, 202) . . . are successively searched. These boundary coordinate data plotted on the X-Y plane are shown in FIG. 10.

The method for determining the position of the boundary from the boundary coordinate data distributed in an L-shape as shown in FIG. 10 will now be described.

The boundary coordinate data distributed in the L-shape is approximated by two lines crossing at right angles to each other, and the crossing point of these two lines is determined as the position of the boundary.

Considering the boundary coordinate data of 0~m obtained by 3×3 matrix boundary extraction method, the boundary coordinate data are divided into region I and region II, and the data are obtained by the approximated method of least squares corresponding to each of the regions I and II. As shown in FIG. 11, the data are classified as regions I and II according to the point $(X_n, Y_n)$. Therefore, the data corresponding to the regions I and II are as follows.

| Region I: | $(X_0, Y_0)$, $(X_1, Y_1)$, ... $(X_{n-1}, Y_{n-1})$, $(X_n, Y_n)$ |
|---|---|
| Region II: | $(X_n, Y_n)$, $(X_{n+1}, Y_{n+1})$, ... $(X_{m-1}, Y_{m-1})$, $(X_m, Y_m)$ |

The lines approximating and corresponding to the data group for each regions are expressed by:

Region I: $Y = a \cdot X + b$  equation (i)

Region II: $Y = c \cdot X + d$  equation (ii)

On the other hand, from the condition that the lines cross at right angles;

$a \cdot d = -1$  equation (iii)

must be satisfied. (In FIG. 11, the lines α and β correspond to the equations (i) and (ii).)

Then, a square sum Z of the deviation e between two lines of equations (i) and (ii) and the boundary coordinate date of the regions I and II is determined. The deviation e is equal to the distance between the boundary coordinate data (X, Y) and the approximate line. The deviations e of the regions I and II, when the inclination of the L-shaped boundary with respect to the reference coordinate system, are, from equations (i), (ii) and (iii);

Region I: $e_i = Y_i - (a \cdot X_i + b)$  equation (iv)

Region II: $e_j = Y_j - (-a \cdot Y_j + d)$  equation (v)

Therefore, the square sum Z of the deviation e is;

$Z = \Sigma(Y_i - a \cdot i - b)^2 + \Sigma(X_j + a \cdot Y_j - d)$  equation (vi)

$(i = 0 \sim n, j = n \sim m)$

Thus, the square sum Z is a function of variables a, b, d and n which is f(a, b, d, n). Therefore, two lines approximating the boundary coordinate data $(X_0, Y_0)$, $(X_1, Y_1)$, . . . $(X_m, Y_m)$ can be obtained by solving the following four simultaneous equations which are obtained by deviation differentiating the function f in terms of the variables a, b, d and n:

$\partial f / \partial a = 0$ $\partial f / \partial b = 0$ $\partial f / \partial d = 0$ $\partial f / \partial n = 0$  equation (vii)

Two lines thus obtained are shown in FIG. 12. By defining the crossing point $(X_c, Y_c)$ of the two lines as the position of the boundary, the boundary position can be immediately determined.

In the above described embodiment, in order to obtain the boundary information of the square pattern, the blue filter 26c, the green filter 26b, the red filter 26a of the filter disc 26 are used to successively irradiate the printing paper 30 with blue light, green light and red light. However, the so-called color TV camera in which a two-dimensional photoelectric conversion element is connected to each of the blue, green and red filters may be used to obtain the boundary information.

Also, while the filter disc 26 is placed in front of the white light source, the filter disc 26 may be installed in front of the two-dimensional photoelectric conversion element 16.

Also, the dispersion of white light into blue, green and red lights is achieved by the filter disc 26 in the above embodiment, a suitable prism may equally be used.

Further, a filter disc in which an array of the blue filter 26c, the green filter 26b and the red filter 26a is repeatedly arranged on the disc at an equal disc diameter may be used.

Also, while white light is used as the light source in the above embodiment, a He-Ne laser oscillating a particular wavelength light may be used.

Further, while the pulse motors 23, 24 and 25 are used to determine the feed position of the X-Y table 12 and the rotational position of the filter disc 26, a drive unit comprising, in combination, a DC motor, a rotational position detector for detecting the rotational position of the DC motor, and a control circuit for controlling the DC motor may also be used to achieve the same object.

Also, while the 3×3 matrix boundary extraction method in which the search is carried out with any arbitrary point used as the center and the search is effected in the front and rear, right and left, diagonally front right, front left, rear right and rear left, has been described as the method for extracting the boundary coordinate data, the 2×2 matrix boundary extraction method in which the search is carried out within a 2×2 matrix having the arbitrary point at an end may also be used.

Figure 13:
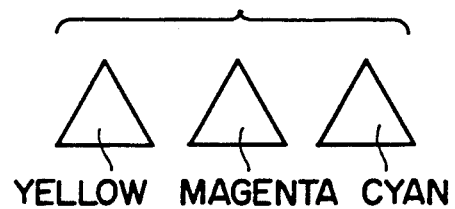
FIG. 13 is a view showing the second example of the test pattern.
Figure 14:
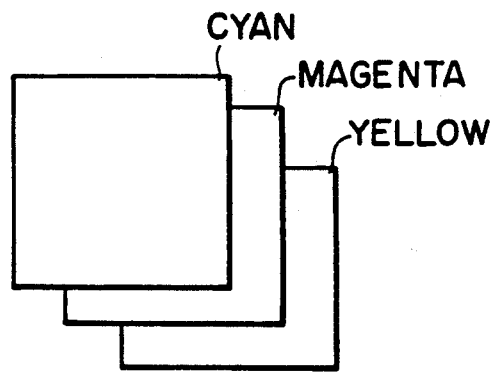
FIG. 14 is a view showing the third example of the test pattern.

While the description has been made as to the case where a square pattern is used as a test pattern, other patterns can of course be equally used. For example, as shown in FIG. 13, a pattern in which yellow, magenta and cyan having an independently printed geometrical shape such as a triangle may be used. Also, as shown in FIG. 14, square patterns of the respective colors of yellow, magenta and cyan may be printed in an overlapping relationship with a displacement in one direction.

As has been described, according to the present invention, the record position measuring apparatus comprises irradiation means for irradiating light of a plurality of predetermined wavelength zones to a recording medium on which a color pattern is recorded, two-dimensional imaging means for imaging the color pattern to provide image information, storing means for storing the image information, and operating means for calculating the distance between the color pattern and a reference position according to the image information stored in the storing means, so that the record position of the basic color inks on the color recording medium can advantageously be precisely measured within a short time.

What is claimed is:

1. A recorded pattern position measuring apparatus comprising:
   a recording medium having at least one color pattern defined by a number of different color elements;
   a light source which irradiates light onto said recording medium;
   a light filtering means for dividing light from said source and reflected from the pattern on said recording medium into a plurality of predetermined wavelength bands;
   two-dimensional imaging means for recording images of the color pattern and providing image intensity information for each of the different colors in the form of change between "0" and "1", determined according to whether light of the predetermined wavelength bands has an intensity value that exceeds a preset threshold intensity value;
   an image memory which stores the image intensity information in the form of "0" or "1" as words in memory matrix; and
   means for determining boundaries of each of the different color elements using boundary data points and for calculating printing displacement of the different colors based upon location of the boundaries.

2. A recorded pattern position measuring apparatus comprising:
   a recording medium having at least one color pattern defined by a number of different color elements;
   a light source which irradiates light onto said recording medium;
   a light filtering means for dividing light from said source reflected from the pattern on said recording medium into a plurality of predetermined wave length bands;
   two-dimensional imaging means for recording images of the color pattern and providing image intensity information in the form of change between "0" and "1" at a threshold intensity value defining a boundary of the different color elements using light of the predetermined wave length bands, respectively, reflected from the pattern on said recording medium; and
   a computer connected to said imaging means which calculates printing displacement of the color elements relative to each other based on the image intensity information of each color element.

3. An apparatus according to claim 2, further comprising a planer table which supports said recording medium and a planer bed which supports said planer table.

4. An apparatus according to claim 3 including a pair of pulse motors connected to said planer table for shifting said planer table in the X and Y directions relative to the planer bed to align the color pattern with an optical axis of said imaging means.

5. An apparatus according to claim 2 where said two-dimensional imaging means includes a photoelectric transducer.

6. An apparatus according to claim 5 where said two-dimensional imaging means further includes an optical system that transmits reflected light to said photoelectric transducer.

7. An apparatus according to claim 5 where the light filtering means is a filter disc.

8. An apparatus according to claim 7 where said filter disc is rotatable.

9. An apparatus according to claim 7 where said filter disc is disposed in front of said photoelectric transducer.

10. An apparatus according to claim 7 where said filter disc is disposed in front of said light source.

11. An apparatus according to claim 5 where said light filtering means is a prism.

12. A recorded pattern position measuring apparatus comprising:
   a recording medium having at least one color pattern defined by a number of different color elements;
   a light source which irradiates light onto said recording medium;
   a filter disc disposed between said recording medium and said light source which divides light irradiated on said recording medium into a plurality of predetermined wave length bands;
   an optical system which collects light reflected from said recording medium and converts it into focused light;
   a photoelectric transducer which transforms focused light transmitted from said optical system into an electrical signal representing image intensity of the different color elements;
   means including an image memory for converting the electrical signal into a digital signal and storing the digital signal in memory; and
   a computer which calculates printing displacement of the color elements relative to each other based on image intensity information contained in the digital signal.

13. A recorded pattern position measuring apparatus comprising:
   a recording medium having at least one color pattern defined by a number of different color elements each having a boundary;
   a light source which irradiates light onto said recording medium;
   a light filtering means for dividing light from said source and reflected from the pattern on said recording medium into a plurality of predetermined wavelength bands;
   two-dimensional imaging means for recording images of the color pattern and providing image intensity information for each of the different colors in the form of change between "0" and "1", determined according to whether light of the predetermined wavelength bands has an intensity value that exceeds a preset threshold intensity value;
   an image memory which stores the image intensity information in the form of "0" or "1" as words in a memory matrix;
   a computer which determines boundary positions of each of the different color elements and calculates printing displacement of the different color elements by:
1) testing the memory matrix and selecting an address $(X_m, Y_n)$ where the image intensity changes between "0" and "1" as a first boundary data point and using that address as a first center address,
2) testing surrounding addresses in a counterclockwise direction using an address $(X_m, Y_n-1)$ as a starting address,
3) selecting an address where the image intensity changes between "0" and "1" as a second boundary data point,
4) using the first center address as a starting address and using the second boundary data point as a center address and testing surrounding addresses in a counterclockwise direction,
5) selecting an address where the image intensity changes between "0" and "1" as a boundary data point,
6) continuing to test the memory matrix until all boundary data points have been selected;

said computer using boundary data points to determine the position of the boundary and calculate printing displacement of the different colors.

* * * * *